United States Patent
Langlet et al.

(10) Patent No.: US 11,639,951 B2
(45) Date of Patent: May 2, 2023

(54) MEASUREMENT METHOD, PROGRAM AND DEVICE FOR MEASURING POWER OR ENERGY OF AN ELECTRIC MOTOR

(71) Applicant: Electricite de France, Paris (FR)

(72) Inventors: Jérémy Langlet, Ville d'Avray (FR); Abdessalim Arras, Athis Mons (FR)

(73) Assignee: Electricite de France

( * ) Notice: Subject to any disclaimer, the term of this patent is extended or adjusted under 35 U.S.C. 154(b) by 310 days.

(21) Appl. No.: 16/954,794

(22) PCT Filed: Dec. 12, 2018

(86) PCT No.: PCT/EP2018/084484
§ 371 (c)(1),
(2) Date: Jun. 17, 2020

(87) PCT Pub. No.: WO2019/121203
PCT Pub. Date: Jun. 27, 2019

(65) Prior Publication Data
US 2021/0096162 A1   Apr. 1, 2021

(30) Foreign Application Priority Data

Dec. 19, 2017   (FR) ...................................... 1762453

(51) Int. Cl.
*G01R 21/133*   (2006.01)
*G01R 21/00*    (2006.01)
(Continued)

(52) U.S. Cl.
CPC ....... *G01R 21/1331* (2013.01); *G01R 21/002* (2013.01); *G01R 31/343* (2013.01); *H02K 17/30* (2013.01)

(58) Field of Classification Search
CPC ..... G05B 15/02; H02P 21/18; H02P 2205/01; H02P 2205/07
See application file for complete search history.

(56) References Cited

U.S. PATENT DOCUMENTS

2003/0163296 A1* 8/2003 Richards ................. H02P 21/16
                                                       703/14
2004/0260488 A1* 12/2004 Al-Hamrani ............. H02P 5/74
                                                       702/60
(Continued)

FOREIGN PATENT DOCUMENTS

CN   102707233 A   10/2012
CN   103399271 A   11/2013
(Continued)

OTHER PUBLICATIONS

International Search Report for PCT/EP2018/084484 dated Mar. 28, 2019; 2 pages.

*Primary Examiner* — Jermele M Hollington
*Assistant Examiner* — Temilade S Rhodes-Vivour
(74) *Attorney, Agent, or Firm* — Lerner David LLP

(57) ABSTRACT

The invention concerns a method for measuring a power (Pe, Pm) of an electric motor, that involves measuring a real current (I) of the motor, by means of a measurement sensor (11), the invention being characterised in that it involves inputting, on an interface (20), at least one piece of nominal power data (Pn), one piece of nominal speed data (Wn), one piece of nominal current data (In), one piece of nominal voltage data (Un), one piece of power factor data (cos φ) and the real current (I) of the engine, calculating, in the computer, a no-load current of the motor according to a first stored function depending on at least the data (Pn, In, Un, cos φ), calculating, in the computer, the active power (Pe) and/or the mechanical power (Pm) and/or the active energy and/or the mechanical energy according to at least one second stored function depending on at least the data (Pn, In), the real current (I) and the no-load current that has been calculated, and providing the power that has been calculated on an output interface (24).

17 Claims, 5 Drawing Sheets

Figure 1:
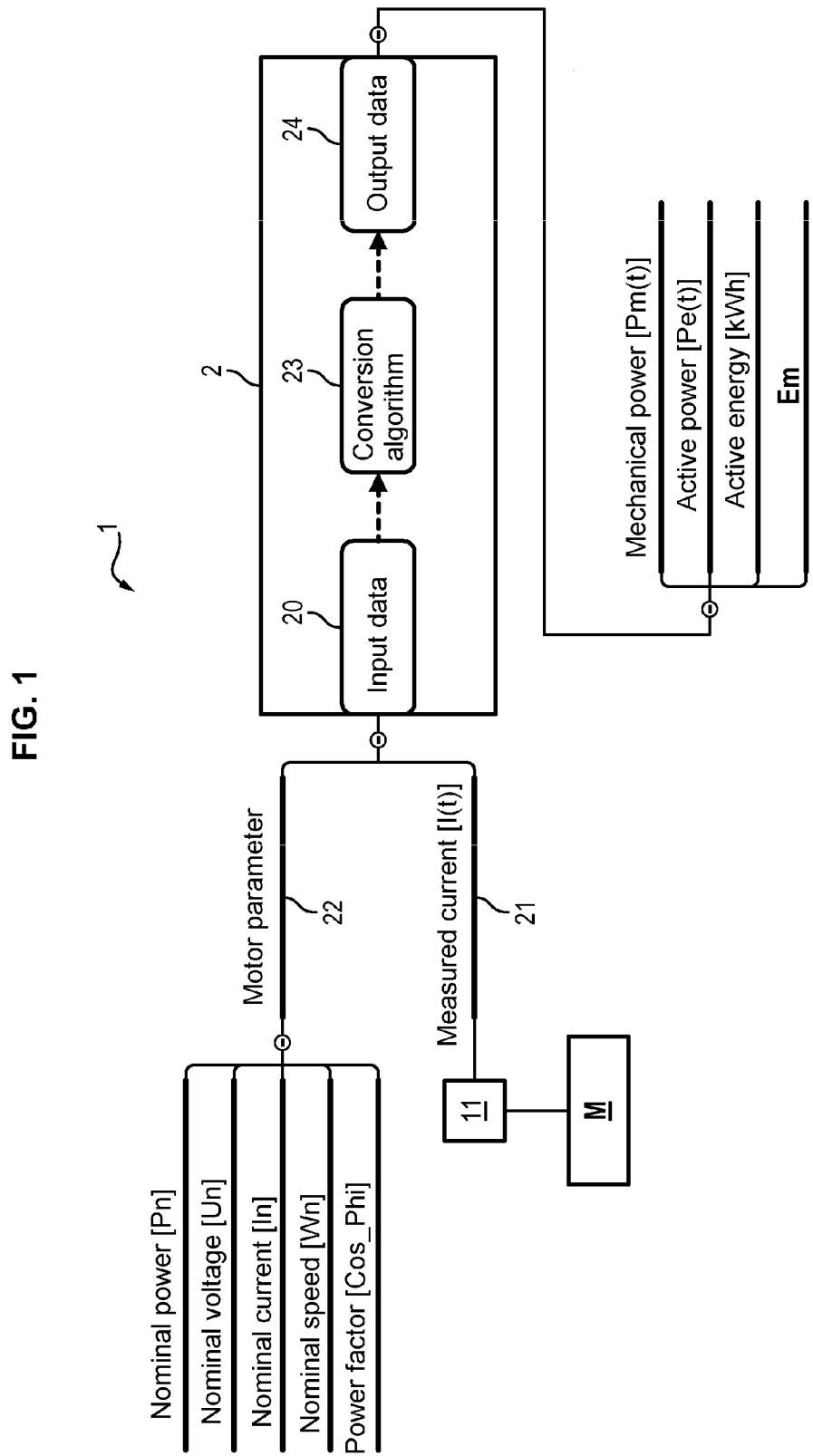

(51) Int. Cl.
    *G01R 31/34*     (2020.01)
    *H02K 17/30*     (2006.01)

(56) References Cited

U.S. PATENT DOCUMENTS

| | | | | |
|---|---|---|---|---|
| 2007/0247091 | A1* | 10/2007 | Maiocchi | H02M 3/1588 |
| | | | | 713/300 |
| 2015/0002072 | A1* | 1/2015 | Mo | H02P 23/28 |
| | | | | 318/807 |
| 2015/0088441 | A1 | 3/2015 | Nakata et al. | |
| 2015/0311849 | A1* | 10/2015 | Zhang | H02P 23/14 |
| | | | | 318/799 |
| 2017/0222588 | A1* | 8/2017 | Royak | H02P 27/06 |

FOREIGN PATENT DOCUMENTS

| | | |
|---|---|---|
| CN | 106772050 A | 5/2017 |
| EP | 2549280 A1 | 1/2013 |
| FR | 2999326 A1 | 6/2014 |
| JP | 2013099033 A1 | 4/2015 |
| JP | 2015087240 A | 5/2015 |

\* cited by examiner

MEASUREMENT METHOD, PROGRAM AND DEVICE FOR MEASURING POWER OR ENERGY OF AN ELECTRIC MOTOR

CROSS-REFERENCE TO RELATED APPLICATIONS

The present application is a national phase entry under 35 U.S.C § 371 of International Application No. PCT/EP2018/084484 filed Dec. 12, 2018, which claims priority from French Application No. 1762453 filed Dec. 19, 2017, all of which are hereby incorporated herein by reference.

The invention relates to a method and a device for measuring electrical quantities of an electric motor.

The field of the invention relates to all types of electric motors, in particular asynchronous electric motors.

Most electric motors comprise a nameplate indicating the nominal power of the motor, the nominal speed of the motor, the nominal voltage of the motor, the nominal current of the motor, and the power factor of the motor.

The electric consumption of the motors represents more than 70% of the industrial bill. This share can be significantly reduced by optimizing the regulation and sizing of the motors. Indeed, there is a great potential for energy saving because many motors are regulated by mechanical methods which base their regulations on load drops rather than on the variation of the rotation speed of the motor. However, the use of an electronic speed variator allows saving up to 30% of consumption. In addition, ignoring the work provided by the motor, manufacturers tend to over-size them, which has the effect of degrading their overall yields.

The replacement of a motor and/or its regulation represents an investment that must be amortized. However, depending on whether the motor load is highly variable or not, the consumption savings can be completely different for two identical motors having the same type of regulation.

Currently, relatively few measurements of electrical quantities such as active power and/or mechanical power and/or active energy and/or mechanical energy are carried out on the electric motor due to the complexity of implementation, the intrusive nature of the method and the general ignorance of the operation of the motors. Indeed, in order to measure the power of a motor over time, the use of a wattmeter requires the installation of three current clamps and three voltage probes which, without taking into account the risk of wiring error, involve sometimes stopping production. In addition, traditional wattmeters need their own electrical power source (most often 220V), which is not common in the industry.

The document FR-A-2 999 326 describes a system for monitoring an electrical device, the system comprising for each electrical device an associated sensor having the function of providing at least one measurement value of an electric current of this electrical device, the sensor being associated with a member for wireless transmission of the electric current measurement value provided by the sensor to a remote receiving member connected to a calculator, comprising means for calculating at least one operating parameter of the electrical device, other than its electric current, from the electric current measurement value received from the receiving member and from at least one predetermined feature of the electric device, recorded in a memory, this feature being a 2-degree polynomial function of the electric current measured value. The operating parameter is an active power and/or a relative active power of the electric motor or a parameter on the operation of a machine driven by an electric motor of the electric device, such as for example the hydraulic flow in the case of a pump, the air flow when it is a compressor, or the like. These parameters are calculated according to the current measurement value(s) and according to features on the no-load current, the nominal power, the nominal current, the power factor, the supply voltage, the synchronous speed.

The disadvantage of the monitoring system according to document FR-A-2 999 326 is that the errors of conversion of the current into said parameter can be different from one motor to another and tend to increase if the power delivered by the motor decreases.

The invention aims at obtaining a method and a device for measuring the active power and/or the mechanical power and/or the active energy and/or the mechanical energy of the electric motor, which overcomes the disadvantages of the prior art, being simple to implement, minimally intrusive and improving the measurement to take into account the diversity of electric motors.

To this end, a first subject matter of the invention is a method for measuring an active power and/or a mechanical power and/or n active energy and/or a mechanical energy of an electric motor, wherein a real current of the motor is measured by at least one measurement sensor, characterized in that at least a nominal power datum of the motor, a nominal speed datum of the motor, a nominal current datum of the motor, a nominal voltage datum of the motor, a power factor datum of the motor and the real current of the motor are inputted on at least one input interface of a calculator, a no-load current of the motor is calculated in the calculator according to a first recorded function depending at least on the nominal power datum of the motor, on the nominal current datum of the motor, on the nominal voltage datum of the motor and on the power factor datum of the motor, the active power and/or the mechanical power and/or the active energy and/or the mechanical energy are/is calculated in the calculator according to at least one second recorded function depending at least on the nominal power datum of the motor, on the nominal current datum of the motor, on the real current and on the no-load current having been calculated, the active power and/or the mechanical power and/or the active energy and/or the mechanical energy, having been calculated, are/is provided on an output interface of the calculator.

The inventors, by analyzing a large number of electric motors, have determined that the calculation of the active power and/or the mechanical power and/or the active energy and/or the mechanical energy in each rotation speed range was governed by the aforementioned two first and second functions, with the fact that the no-load current depends on the aforementioned nominal data without depending on the real measured current, while the power depends on the no-load current, the real measured current and part of the nominal data.

Different simulations have shown that the various curves of power evolution as a function of the real measured current are not directly linked to the nominal data of the motors. For example, in FIG. 3, the curves C1 and C2 of the evolution of respectively two examples of motors called motor 1 and motor 2 are very similar, while these two motors have neither the same power nor the same speed of rotation in common, nor the same nominal data in table 1 below:

TABLE 1 example of data of two motors

| Nominal datum | Motor 1 | Motor 2 |
| --- | --- | --- |
| nominal power datum (Pn) of the motor | 30 kW | 15 kW |
| nominal voltage datum (Un) of the motor | 400 V | 380 V |
| nominal current datum (In) of the motor | 56.3 = A | 29.4 A |
| power factor datum (cosφ) of the motor | 0.84 | 0.88 |
| nominal speed datum (Wn) of the motor | 1460 rpm | 2930 rpm |

To be able to estimate the power delivered by a motor according to the current which it consumes and to its nameplate, the inventors have established a relation between their origins on the abscissa axis (at zero power) and the various data of the nameplate.

Physically, the point of origin of each curve of evolution of the power as a function of the real current represents the part of current consumed by a motor when the latter delivers no power, this particular point is noted I0 in what follows. It is from this point that the evolution curve of each motor is calculated.

As the information of the nameplate of the motors is not sufficient to construct an equivalent electrical model to calculate the value of the no-load current I0, a genetic algorithm was used to find a relationship between the nameplate and the current I0.

According to one embodiment of the invention, the active power and/or the mechanical power and/or the active energy and/or the mechanical energy are/is calculated in the calculator according to at least one second recorded function depending at least on the nominal power datum of the motor, on the nominal current datum of the motor, on the real current, on the no-load current having been calculated and on a deviation of the nominal speed datum of the motor from a prescribed reference value of the nominal speed of the motor.

According to one embodiment, the prescribed reference value of the nominal speed of the motor is equal to 3000 revolutions per minute.

The inventors have determined that the first function could be modeled to within a constant by multiplying factors formed by the nominal power datum of the motor, the nominal current datum of the motor, the nominal voltage datum of the motor, the power factor datum of the motor and the deviation of the nominal speed datum of the motor from a prescribed reference value of the nominal speed of the motor, each raised to a certain respective associated exponent.

Thus, according to one embodiment, the first function comprises factors multiplied together, which respectively depend on the nominal power datum of the motor, on the nominal current datum of the motor, on the nominal voltage datum of the motor, on the power factor datum of the motor and on the deviation of the nominal speed datum of the motor from a prescribed reference value of the nominal speed of the motor.

According to one embodiment, the first function is of the form $$I0 = (Pn)^{x1} \cdot (In)^{x2} \cdot (Un)^{x3} \cdot (\cos \varphi)^{x4} \cdot (REF - Wn)^{x5} + x6,$$

where I0 is the no-load current of the motor,
Pn is the nominal power datum of the motor,
x1, x2, x3, x4, x5, x4, x5 and x6 are prescribed real coefficients,
Pn is the nominal power datum of the motor,
In is the nominal current datum of the motor,
Un is the nominal voltage datum of the motor,
cos φ is the power factor datum of the motor.
Wn is the nominal speed datum of the motor,
REF is the prescribed reference value of the nominal speed of the motor.

According to one embodiment,
x1 is a strictly negative prescribed real coefficient,
x2 is a strictly positive prescribed real coefficient,
x3 is a strictly positive prescribed real coefficient,
x4 is a strictly negative prescribed real coefficient,
x5 is a strictly negative prescribed real coefficient,
x6 is a strictly negative prescribed real coefficient.

The algorithm has been parametrized so that it searches for the values of the exponents of the equation to reduce the total error on the no-load current.

The simulation results on a hundred motors with various features were analyzed to establish the second function.

According to one embodiment, the mechanical power Pm(t) of the motor is calculated in the calculator by the following second function:

$$Pm(t) = Pn \cdot \sqrt{\log(A \cdot (I_{red}(t))^3 + B \cdot (I_{red}(t))^2 + C \cdot (I_{red}(t)) + D)}$$

where
Pn is the nominal power datum of the motor, $$I_{red}(t) = \frac{I(t)}{In}$$

I(t) is the real current,
In is the nominal current datum of the motor,
A, B, C and D are prescribed real coefficients.

According to one embodiment, the prescribed real coefficients A, B, C and D are different functions of the no-load current, having been calculated.

According to one embodiment, the prescribed real coefficient A is an exponential of a first polynomial function of the no-load current (I0), having been calculated.

Thus, the inventors have determined that by interpolating the exponential of the square of the curve, the degree of the polynomial function could be of degree 3 and be less sensitive to small errors in the calculation of its coefficients, according to one embodiment.

According to one embodiment, correlations have been sought between the value of the coefficients A, B, C and D and the descriptive data. According to one embodiment, the coefficient A is interpolated according to the no-load current and the coefficients B, C and D are interpolated according to the coefficient A. Thus, according to a first embodiment, $$A = \exp((a_1 \cdot (I0)^2 + a_2 \cdot I0 + a_3)^2)$$

$$B = b_1 \cdot A^2 + b_2 \cdot A + b_3$$

$$C = c_1 \cdot A^2 + c_2 \cdot A + c_3$$

$$D = d_1 \cdot A^2 + d_2 \cdot A + d_3$$

where
I0 is the no-load current of the motor, $a_1, a_2, a_3, b_1, b_2, b_3, c_1, c_2, c_3, d_1, d_2, d_3$ are prescribed real coefficients. This corresponds for example to the first family described below.

To reduce the deviations at low powers and at low values of the no-load current, the coefficients of the second function have been readjusted by a new interpolation on the correlation between the coefficients A, B, C and D and the value of the no-load current from the estimate. This readjustment has modified the calculation of the coefficients A, B, C and D. Thus, according to a second embodiment, $$A = \exp((a_1 \cdot (I0)^4 + a_2 \cdot (I0)^3 + a_3 \cdot (I0)^2 + a_4 \cdot I0 + a_5)^2)$$

$$B = -\exp((b_1 \cdot (I0)^4 + b_2 \cdot (I0)^3 + b_3 \cdot (I0)^2 + b_4 \cdot I0 + b_5)^2)$$

$$C = \exp((c_1 \cdot (I0)^4 + c_2 \cdot (I0)^3 + c_3 \cdot (I0)^2 + c_4 \cdot I0 + c_5)$$

$$D = -\exp(d_1 \cdot (I0)^4 + d_2 \cdot (I0)^3 + d_3 \cdot (I0)^2 + d_4 \cdot I0 + d_5) + 1$$

where
I0 is the no-load current of the motor,
$a_1, a_2, a_3, a_4, a_5, b_1, b_2, b_3, b_4, b_5, c_1, c_2, c_3, c_4, c_5, d_1, d_2, d_3, d_4, d_5$ are prescribed real coefficients. This corresponds for example to the second family described below.

According to one embodiment, the active power is calculated according to the mechanical power, the real current, the power factor datum of the motor, the nominal voltage datum of the motor and the nominal power datum of the motor.

According to one embodiment, the active power $P_{active}(t)$ is calculated according to the following formulas:

$$P_{active}(t) = P_m(t) + P_{pertes}(t)$$

$$P_{pertes}(t) = P_{pertesnom} \cdot \left( \frac{1}{3} + \frac{2 \cdot (I_{red}(t))^2}{3} \right)$$

$$I_{red}(t) = \frac{I(t)}{In}$$

$$P_{pertesnom} = Pn \cdot \left( \frac{1}{Rendnom} - 1 \right)$$

$$Rendnom = \frac{Pn}{\sqrt{3} \cdot Un \cdot In \cdot \cos \varphi}$$

where $P_m(t)$ is the mechanical power,
I(t) is the real current,
Pn is the nominal power datum of the motor,
Un is the nominal voltage datum of the motor,
In is the nominal current datum of the motor,
cos φ is the power factor datum of the motor.

According to one embodiment, the active power of the motor is calculated, the active energy of the motor is calculated by temporal integration of the active power of the motor.

According to one embodiment, the mechanical power of the motor is calculated, the mechanical energy of the motor is calculated by temporal integration of the mechanical power of the motor.

A second object of the invention is a computer program comprising code instructions for the implementation of the measurement method as described above, when it is executed on a calculator.

A third object of the invention is a device for measuring an active power and/or a mechanical power and/or an active energy and/or a mechanical energy of an electric motor, the device comprising:

at least one measurement sensor for measuring a real current of the motor by,
characterized in that the device further comprises a calculator comprising at least one interface for inputting at least a nominal power datum of the motor, a nominal speed datum of the motor, a nominal current datum of the motor, a nominal voltage datum of the motor, a power factor datum of the motor and the real current of the motor,
the calculator being configured to calculate a no-load current of the motor according to first recorded functions depending at least on the nominal power datum of the motor, on the nominal current datum of the motor, on the nominal voltage datum of the motor and on the power factor datum of the motor,
the calculator being configured to calculate the active power and/or the mechanical power and/or the active energy and/or the mechanical energy according to at least one second recorded function depending at least on the nominal power datum of the motor, the nominal current datum of the motor, the real current and the no-load current having been calculated,
the calculator comprising an output interface for providing the active power and/or the mechanical power and/or the active energy and/or the mechanical energy, having been calculated.

Figure 2:
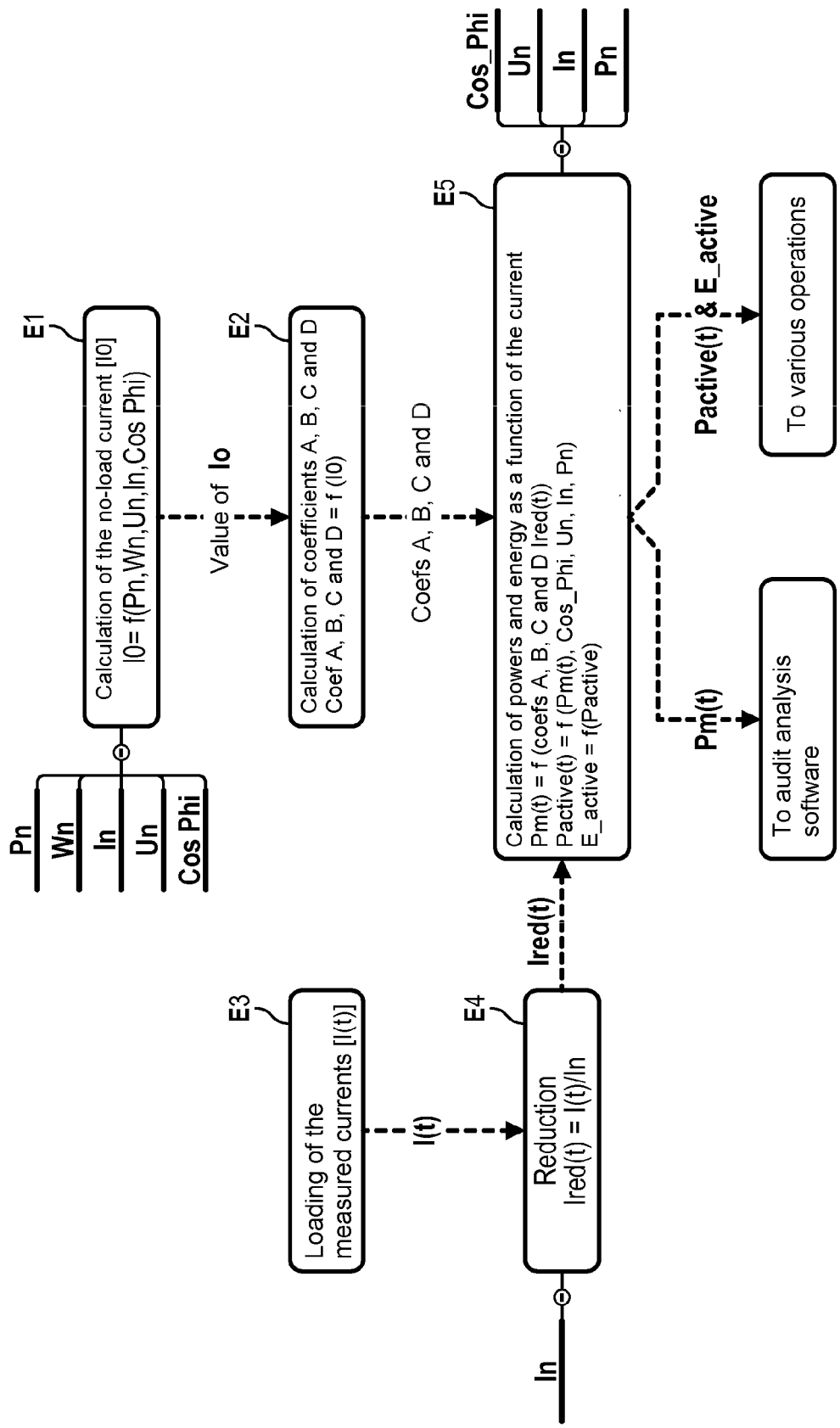
Figure 3:
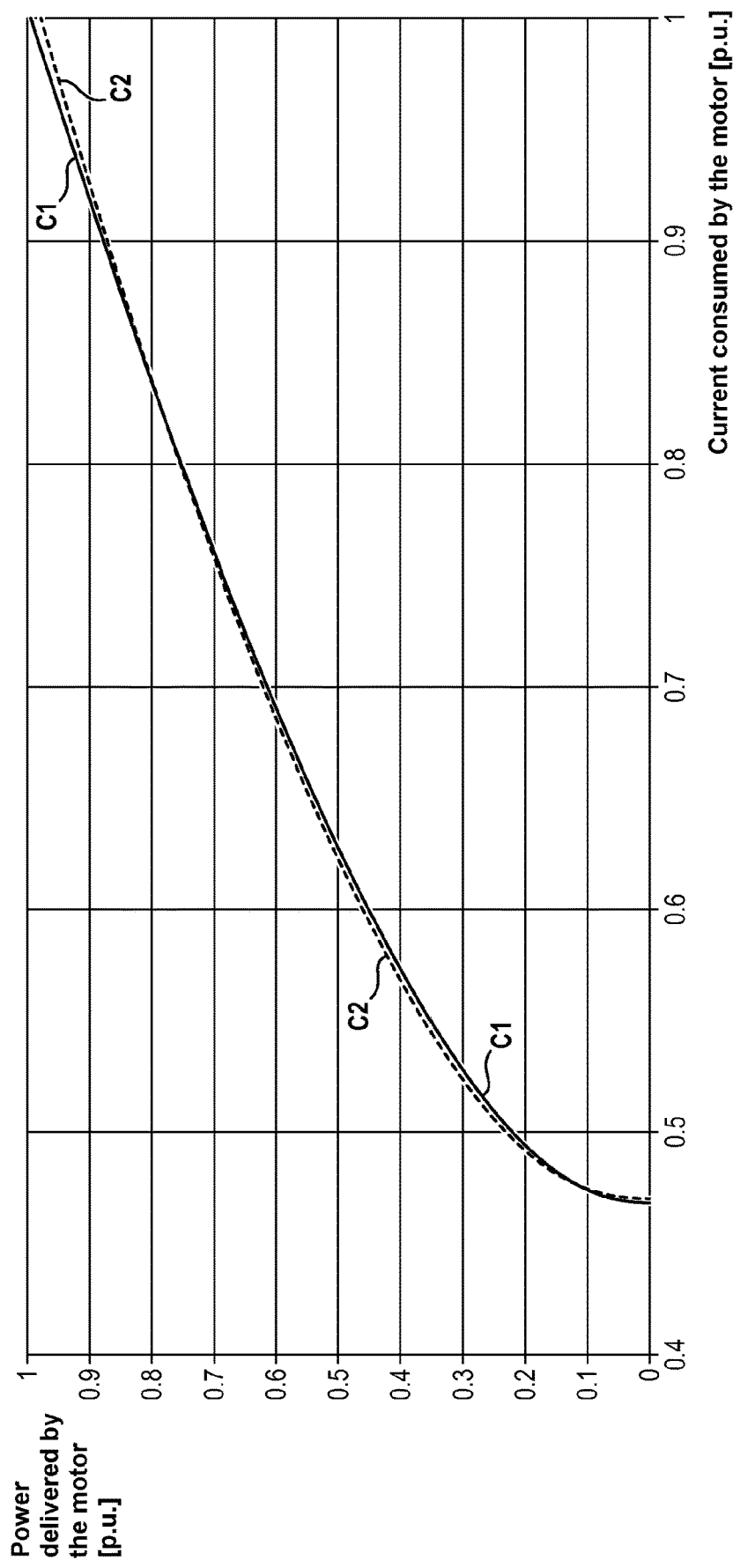
Figure 4:
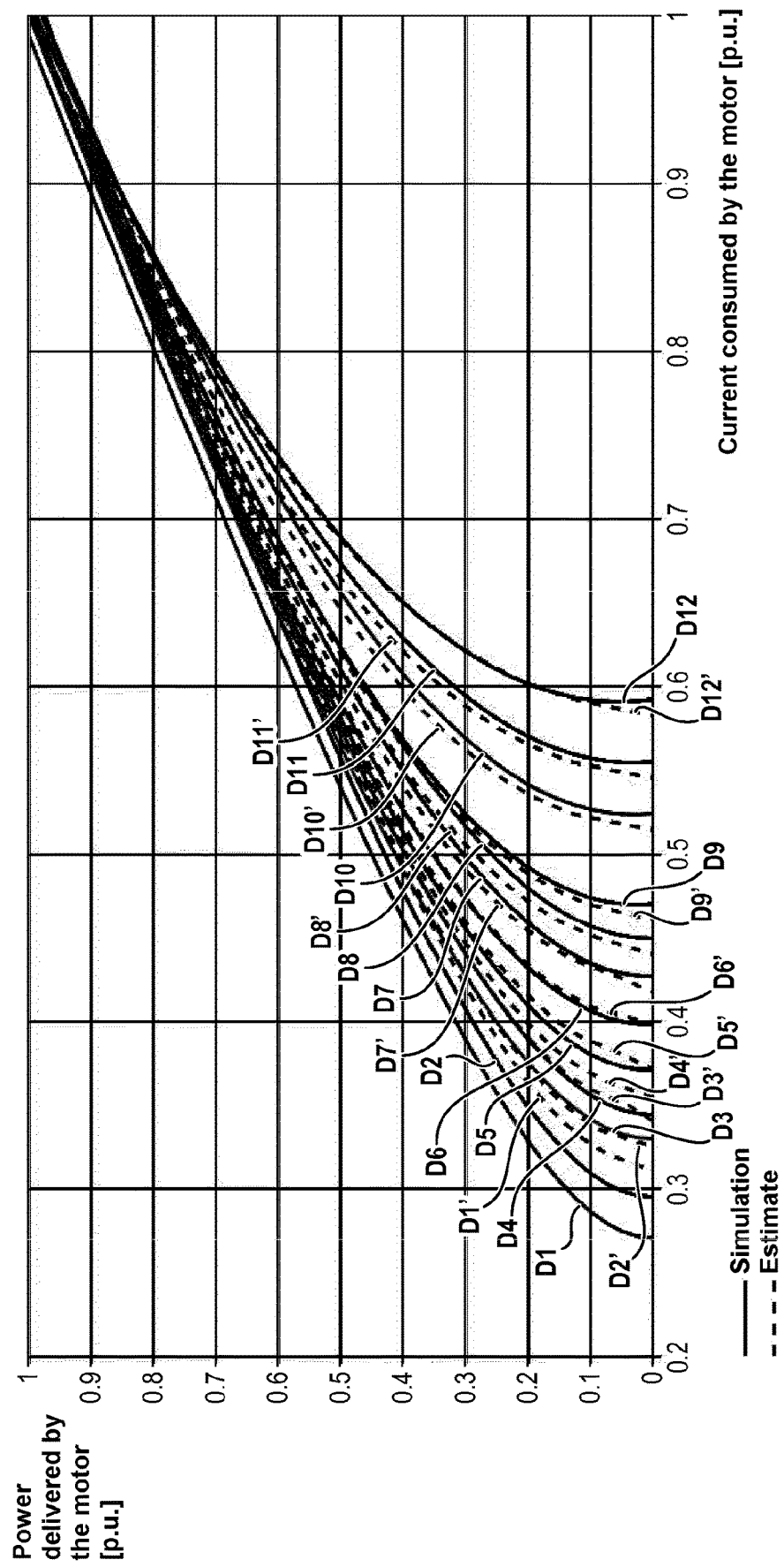
Figure 5:
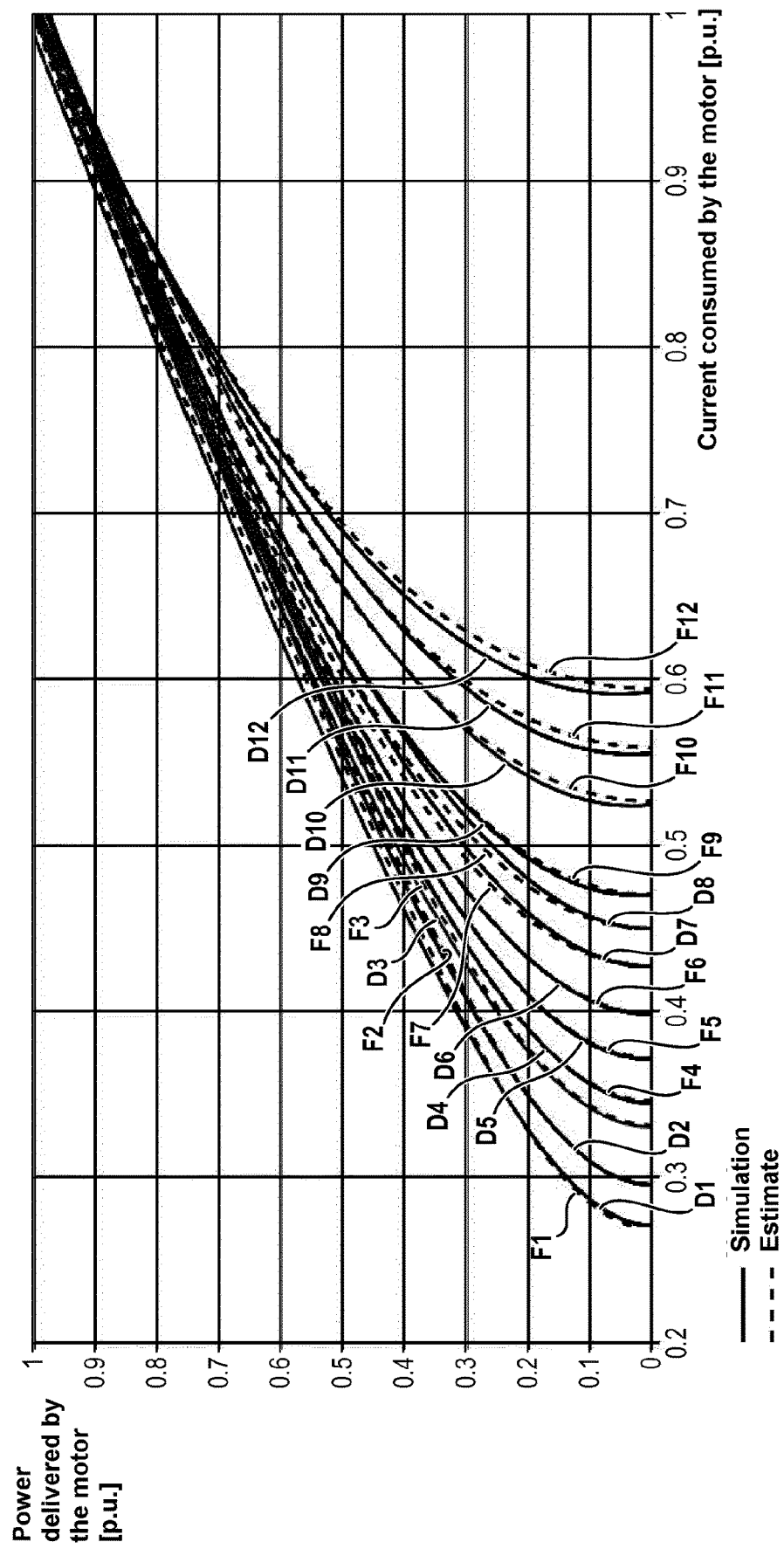

The invention will be better understood upon reading the description which follows, given only by way of non-limiting example with reference to the appended drawings, in which:

FIG. 1 schematically shows a measurement device according to an embodiment of the invention, FIG. 2 schematically shows a flowchart of the measurement method according to an embodiment of the invention, FIG. 3 shows evolution curves of the power on the ordinate as a function of the consumed current of two examples of motors of the state of the art, FIG. 4 shows estimated power curves according to a first embodiment of the invention and the mechanical power delivered and simulated for different respective motors, FIG. 5 shows estimated power curves according to a second embodiment of the invention and the mechanical power delivered and simulated for different respective motors.

In FIG. 1, the measurement device 1 according to the invention implements a measurement method comprising one or more of the steps mentioned below.

The measurement device 1 comprises one or more measuring sensor(s) 11, which are installed on one or more electric motor(s) M and which measure(s) a real electric current I of the motor M, this real current being also noted I(t) and being also called measured current. This measured current I or I(t) can be an instantaneous real current. The electric motor(s) M can be an asynchronous electric motor, in particular a three-phase asynchronous electric motor. The motor M can be a direct-feed motor, that is to say without speed variator. The motor M can have, for example, a synchronous speed of 1500 or 3000 revolutions per minute. The motor M can be a low voltage motor, for example less than or equal to 1000 V. The value of the real measured current I is sent to a first input 21 of an input interface 20 of a calculator 2. The value of the real measured current I is for example an effective value (RMS current) of the electric current of the motor and can be punctual or over a period of time. The first input 21 can be a real-time input of the measured current I of the motor M. The first input 21 is linked to the sensor 11 by a connection member, which can be a wired connection member or a wireless connection member (that is to say comprising a receiver which is linked to the first input 21 and which receives the measured current value I, sent via a wireless link by a transmitter connected to the sensor 11).

Furthermore, a nominal power datum Pn of the motor and a nominal speed datum Wn of the motor are inputted on a second input 22 of the interface 20. The nominal speed datum Wn of the motor is expressed for example in revolutions per minute. The second input 22 of the interface 20 is for example a man-machine interface, which can be manual for inputting the data, and can be for example a computer keyboard and/or manual keys and/or a touch screen or the like. According to embodiments, a nominal voltage datum Un of the motor, a nominal current datum In of the motor and a power factor datum cos φ (also denoted cos Phi) of the motor are also inputted on the second input 22 of the interface 20. The data are for example inputted on the input 22 by the user, who for this purpose has read this data on a nameplate of the motor M and who actuates the man-machine interface. Thus, the aforementioned data are called nominal data of the motor M or descriptive data of the motor M. The measurement device 1 and the measurement method can use a computer program comprising code instructions for the implementation of the described steps.

The calculator 2 comprises a calculation module 23 connected to the interface 20 and configured to calculate a no-load current I0 of the motor according to a first recorded function depending at least on the nominal power datum Pn of the motor, on the nominal current datum In of the motor, on the nominal voltage datum Un of the motor and on the power factor cos φ datum of the motor. The nominal speed datum Wn of the motor is different from a synchronous speed of the motor M, this nominal speed datum Wn of the motor being less than the synchronous speed of the motor M.

The calculation module 23 is configured to calculate the value of the active power Pe (also denoted Pe(t) or $P_{active}(t)$) and/or the mechanical power Pm (also denoted Pm(t) or $P_m(t)$) of the electric motor M and/or the active energy $E_{active}$ of the electric motor M and/or the mechanical energy Em of the electric motor M according to at least the real current I. This calculation is carried out according to at least one second recorded function depending at least on the nominal power datum Pn of the motor, on the nominal current datum In of the motor, on the real current I having been measured and on the no-load current I0 having been calculated. This second recorded function can also depend in addition on a deviation of the nominal speed datum Wn of the motor from a prescribed reference value REF of the nominal speed of the motor. The prescribed reference value REF of the nominal speed of the motor can be inputted on the interface 20 or be pre-recorded in the calculator 2 or in the calculation module 23. The nominal speed datum Wn of the motor is greater than zero and may be less than the prescribed reference value REF of the nominal speed of the motor. For example, the prescribed reference value REF of the nominal speed of the motor is 3000 revolutions per minute, without this being limiting. In this case, the nominal speed datum of the motor Wn can be less than 3000 revolutions per minute.

The calculation module 23 is connected to an output interface 24 of the calculator 2, on which are provided the value of the active power Pe and/or of the mechanical power Pm and/or of the active energy $E_{active}$ and/or of the mechanical energy Em, having been calculated. This output interface 24 may for example be a screen or a display or the like.

Embodiments of the calculation carried out by the calculating module 23 of the calculator 2, are described below with reference to FIG. 2.

According to one embodiment, the first function comprises factors multiplied together, which depend respectively on the nominal power datum Pn of the motor, on the nominal current datum In of the motor, on the nominal voltage datum Un of the motor, on the power factor datum cos φ of the motor and on the deviation of the nominal speed datum Wn of the motor from the prescribed reference value REF of the nominal speed of the motor.

According to one embodiment, each first function has the form $$I0 = (Pn)^{x1} \cdot (In)^{x2} \cdot (Un)^{x3} \cdot (\cos \varphi)^{x4} \cdot (REF - Wn)^{x5} + x6,$$

where I0 is the no-load current of the motor,
Pn is the nominal power datum of the motor,
x1, x2, x3, x4, x5, x4, x5 et x6 and x6 are prescribed real coefficients.

According to one embodiment:
x1 is a strictly negative prescribed real coefficient,
x2 is a strictly positive prescribed real coefficient,
x3 is a strictly positive prescribed real coefficient,
x4 is a strictly negative prescribed real coefficient,
x5 is a strictly negative prescribed real coefficient,
x6 is a strictly negative prescribed real coefficient.

According to one embodiment, $-2 < x1 < -1$, and/or $1 < x2 < 2$, and/or $1 < x3 < 2$, and/or $-2 < x4 < -1$, and/or $-1 < x5 < 0$, and/or $-1 < x6 < 0$.

According to one embodiment, $-1.3 \leq x1 \leq -1.2$, and/or $1.2 \leq x2 \leq 1.3$, and/or $1.2 \leq x2 \leq 1.3$, and/or $-2 \leq x4 \leq -1.9$, and/or $-0.1 \leq x5 \leq 0$, and/or $-0.4 \leq x6 \leq -0.3$.

According to one embodiment, $-1.24 \leq x1 \leq -1.23$, and/or $1.26 \leq x2 \leq 1.27$, and/or $1.22 \leq x2 \leq 1.23$, and/or $-1.91 \leq x4 \leq -1.9$, and/or $-0.02 \leq x5 \leq -0.01$, and/or $-0.33 \leq x6 \leq -0.32$.

In a non-limiting example, the following values of x1, x2, x3, x4, x5, x4, x5 et x6 can be obtained:

$x1 = -1.23$, $x2 = 1.27$, $x3 = 1.23$, $x4=-1.9$, $x5=-0.01$, $x6=-0.33$.

According to one embodiment, the value of the measured current I(t) is reduced by dividing it by the nominal current datum In, to obtain a reduced current $I_{red}(t)$ according to the equation $$I_{red}(t) = \frac{I(t)}{In}.$$

Thus, the values of the reduced current $I_{red}(t)$ could be contained for example in an interval between zero and one.

According to one embodiment, the calculation module 23 is configured to calculate the mechanical power Pm(t) of the motor by the following second function:

$$Pm(t) = Pn \cdot \sqrt{\log(A \cdot (I_{red}(t))^3 + B \cdot (I_{red}(t))^2 + C \cdot (I_{red}(t)) + D)}$$

A, B, C and D are non-zero prescribed real coefficients, pre-recorded in the calculation module 23 or calculator 2.

The prescribed real coefficients A, B, C and D can be different functions of the no-load current I0, having been calculated.

A first family of embodiments for the second function Pm(t) is described below.

According to one embodiment, $A = \exp((a_1 \cdot (I0)^2 + a_2 \cdot I0 + a_3)^2)$ $B = b_1 \cdot A^2 + b_2 \cdot A + b_3$ $C = c_1 \cdot A^2 + c_2 \cdot A + c_3$ $D = d_1 \cdot A^2 + d_2 \cdot A + d_3$ where I0 is the no-load current of the motor, $a_1$, $a_2$, $a_3$, $b_1$, $b_2$, $b_3$, $c_1$, $c_2$, $c_3$, $d_1$, $d_2$, $d_3$ are non-zero prescribed real coefficients.

In the formulas, exp designates the exponential.

According to one embodiment, $2 \leq a_1 \leq 3, -2 \leq a_2 \leq -1, 1 \leq a_3 \leq 2$, $-1 \leq b_1 \leq 0, -3 \leq b_2 \leq -2, 3 \leq b_3 \leq 4$, $0 < c_1 \leq 1, 1 \leq c_2 \leq 2, -3 \leq c_3 \leq -2$, $-1 \leq d_1 \leq 0, -1 \leq d_2 \leq 0, 1 \leq d_3 \leq 2$.

According to one embodiment, $2.9 \leq a_1 \leq 3, -1.2 \leq a_2 \leq -1.1, 1 \leq a_3 \leq 1.1$, $-0.1 \leq b_1 \leq 0, -2.1 \leq b_2 \leq -2, 3.5 \leq b_3 \leq 3.6$, $0 \leq c_1 \leq 0.1, 1.4 \leq c_2 \leq 1.5, -2.9 \leq c_3 \leq -2.8$, $-0.1 \leq d_1 \leq 0, -0.5 \leq d_2 \leq -0.4, 1.9 \leq d_3 \leq 2$.

According to one embodiment, $2.93 \leq a_1 \leq 2.94, -1.15 \leq a_2 \leq -1.14, 1.06 \leq a_3 \leq 1.07$, $-0.02 \leq b_1 \leq -0.01, -2.01 \leq b_2 \leq -2, 3.51 \leq b_3 \leq 3.52$, $0.02 \leq c_1 \leq 0.03, 1.47 \leq c_2 \leq 1.48, -2.83 \leq c_3 \leq -2.82$, $-0.01 \leq d_1 \leq 0, -0.46 \leq d_2 \leq -0.45, 1.95 \leq d_3 \leq 1.96$.

In a non-limiting example, the following values can be obtained $a_1 = 2.94, a_2 = -1.15, a_3 = 1.06$, $b_1 = -0.02, b_2 = -2.01, b_3 = 3.51$, $c_1 = 0.03, c_2 = 1.48, c_3 = -2.82$, $d_1 = -0.01, d_2 = -0.046, d_3 = 1.96$.

This first family of coefficients has allowed to obtain profile shapes relatively close to the power calculated according to this second function relative to the simulated power, as shown in FIG. 4, showing for different respective motors the respective curve D1', D2', D3', D4', D5', D6', D7', D8', D9', D10', D11', D12' of the mechanical power delivered by the motor, calculated (estimated) according to this second function relative to the current consumed by the motor on the abscissa, as well as the respective curve D1, D2, D3, D4, D5, D6, D7, D8, D9, D10, D11, D12 of the simulated mechanical power delivered by the motor.

A second family of embodiments for the second function Pm(t) is described below.

According to one embodiment, the prescribed real coefficient A is an increasing function of the no-load current I0, having been calculated, the prescribed real coefficient B is a decreasing function of the no-load current I0, having been calculated, the prescribed real coefficient C is an increasing function of the no-load current I0, having been calculated, the prescribed real coefficient D is a decreasing function of the no-load current I0, having been calculated.

According to one embodiment, the prescribed real coefficient A is an exponential of a first polynomial function of the no-load current I0, having been calculated.

According to one embodiment, the prescribed real coefficient B is equal to the opposite of an exponential of a second polynomial function of the no-load current I0, having been calculated.

According to one embodiment, the prescribed real coefficient C is an exponential of a third polynomial function of the no-load current I0, having been calculated.

According to one embodiment, the prescribed real coefficient D is equal to the sum of one and the opposite of an exponential of a fourth polynomial function of the no-load current TO, having been calculated.

According to one embodiment, the first and second polynomial functions of the no-load current I0 are each of degree less than or equal to 8.

According to one embodiment, the first and second polynomial functions of the no-load current I0 are each of degree equal to 8.

According to one embodiment, the third and fourth polynomial functions of the no-load current I0 are each of degree less than or equal to 4.

According to one embodiment, the third and fourth polynomial functions of the no-load current I0 are each of degree equal to 4.

To reduce the deviations at low powers and at low values of the no-load current, which appear in FIG. 4, where it can be noted that there are deviations which increase if the power decreases and the greater they are the lower the no-load current, the coefficients of the second function have been readjusted by a new interpolation on the correlation between the coefficients A, B, C and D and the value of the no-load current from the estimate. This readjustment has modified the calculation of the coefficients A, B, C and D as follows.

According to one embodiment, $$A = \exp((a_1 \cdot (I0)^4 + a_2 \cdot (I0)^3 + a_3 \cdot (I0)^2 + a_4 \cdot I0 + a_5)^2).$$

According to one embodiment, $$B = -\exp((b_1 \cdot (I0)^4 + b_2 \cdot (I0)^3 + b_3 \cdot (I0)^2 + b_4 \cdot I0 + b_5)^2)$$

$$C = \exp(c_1 \cdot (I0)^4 + c_2 \cdot (I0)^3 + c_3 \cdot (I0)^2 + c_4 \cdot I0 + c_5)$$

$$D = -\exp(d_1 \cdot (I0)^4 + d_2 \cdot (I0)^3 + d_3 \cdot (I0)^2 + d_4 \cdot I0 + d_5) + 1$$

where
I0 is the no-load current of the motor,
$a_1, a_2, a_3, a_4, a_5, b_1, b_2, b_3, b_4, b_5, c_1, c_2, c_3, c_4, c_5, d_1, d_2, d_3, d_4, d_5$ are non-zero prescribed real coefficients.

According to one embodiment, $$29 \leq a_1 \leq 31, -59 \leq a_2 \leq -57, 41 \leq a_3 \leq 43, -13 \leq a_4 \leq -11, 1 \leq a_5 \leq 3,$$

$$36 \leq b_1 \leq 38, -63 \leq b_2 \leq -61, 35 \leq b_3 \leq 37, -6 \leq b_4 \leq -4, 0 \leq b_5 \leq 2,$$

$$171 \leq c_1 \leq 173, -311 \leq c_2 \leq -309, 207 \leq c_3 \leq 209, -55 \leq c_4 \leq -53, 3 \leq c_5 \leq 5,$$

$$160 \leq d_1 \leq 162, -284 \leq d_2 \leq -282, 181 \leq d_3 \leq 183, -43 \leq d_4 \leq -41, 0 \leq d_5 \leq 2.$$

In a non-limiting example, the following values of $a_1, a_2, a_3, a_4, a_5, b_1, b_2, b_3, b_4, b_5, c_1, c_2, c_3, c_4, c_5, d_1, d_2, d_3, d_4, d_5$ can be obtained:

$$a_1 = 31, a_2 = -58, a_3 = 42, a_4 = -12, a_5 = 2,$$

$$b_1 = 37, b_2 = -62, b_3 = 36, b_4 = -5, b_5 = 0,$$

$$c_1 = 172, c_2 = -310, c_3 = 208, c_4 = -54, c_5 = 4,$$

$$d_1 = 161, d_2 = -283, d_3 = 182, d_4 = -42, d_5 = 1.$$

This second family of coefficients has allowed obtaining that the power calculated according to this second function is relatively faithful to the simulated power, as shown in FIG. 5, representing for different respective motors the respective curve F1, F2, F3, F4, F5, F6, F7, F8, F9, F10, F11, F12 of the mechanical power delivered by the motor, calculated (estimated) according to this second function relative to the current consumed by the motor on the abscissa, as well as the respective curve D1, D2, D3, D4, D5, D6, D7, D8, D9, D10, D11, D12 of the simulated mechanical power delivered by the motor.

According to one embodiment, the active power $P_{active}(t)$ is calculated according to the mechanical power Pm, the real current I, the power factor datum $\cos \varphi$ of the motor, the nominal voltage datum Un of the motor and the nominal power datum Pn of the motor.

According to one embodiment, the active power $P_{active}(t)$ is calculated according to the following formulas:

$$P_{active}(t) = P_m(t) + P_{pertes}(t)$$

$$P_{pertes}(t) = P_{pertesnom} \cdot \left( \frac{1}{3} + \frac{2 \cdot (I_{red}(t))^2}{3} \right)$$

$$I_{red}(t) = \frac{I(t)}{In}$$

$$P_{pertesnom} = Pn \cdot \left( \frac{1}{Rendnom} - 1 \right)$$

$$Rendnom = \frac{Pn}{\sqrt{3} \cdot Un \cdot In \cdot \cos \varphi},$$

where Rendnom designates the efficiency of the motor M,
$P_{pertesnom}$ designates the losses at the nominal point of the motor M,
$P_{pertes}(t)$ designates the calculated losses of the motor M.

According to one embodiment, the active energy $E_{active}$ of the electric motor M can be calculated by temporal integration of the active power Pe having been calculated, according to the following equation:

$$E_{active} = \int_0^t P_{active}(t) \cdot dt,$$

where t designates time.

According to one embodiment, the mechanical energy Em of the electric motor M can be calculated by temporal integration of the mechanical power Pm having been calculated, according to the following equation:

$$Em = \int_0^t Pm(t) \cdot dt,$$

where t designates time.

According to one embodiment, the following algorithm is applied by the calculator 2:
during a step E1, calculation of the no-load current I0,
during a step E2, calculation of the coefficients A, B, C and D,
during a step E3, measurement of the real current I or I(t),
during a step E4, reduction of the current I to calculate the reduced current $I_{red}(t)$,
during a step E5, calculation of the active power Pe and/or the mechanical power Pm and/or the active energy $E_{active}$ and/or the mechanical energy Em according to at least the reduced current $I_{red}(t)$ having been calculated during step E4 and coefficients A, B, C, D calculated during step E2.

The algorithm can operate for example only for asynchronous electric machines with synchronous speeds of 1500 and 3000 revolutions per minute.

The mechanical power Pm having been calculated can be used by an analysis device, such as for example audit analysis software.

The active power Pe and the active energy $E_{active}$ having been calculated can be used by one or more operating devices. The invention thus allows converting the measured current I into a value of the active power Pe and/or the mechanical power Pm and/or the active energy $E_{active}$ and/or the mechanical energy Em.

Of course, the above embodiments, possibilities, features and examples can be combined with one another or be selected independently from one another.

The invention claimed is:
1. A method for measuring an active power and/or a mechanical power and/or an active energy and/or a mechanical energy of motor being electric, wherein
a real current of the motor is measured by at least one measurement sensor, comprising inputting at least a nominal power datum of the motor, a nominal speed datum of the motor, a nominal current datum of the motor, a nominal voltage datum of the motor, a power factor datum of the motor and the real current of the motor on at least one input interface of a calculator, calculating a no-load current of the motor in the calculator according to a first recorded function depending at least on the nominal power datum of the motor, on the nominal current datum of the motor, on the nominal voltage datum of the motor and on the power factor datum of the motor, calculating the active power and/or the mechanical power and/or the active energy and/or the mechanical energy in the calculator according to at least one second recorded function depending at least on the nominal power datum of the motor, on the nominal current datum of the motor, on the real current and on the no-load current having been calculated, providing the active power and/or the mechanical power and/or the active energy and/or the mechanical energy, having been calculated, on an output interface of the calculator.

2. The method according to claim 1, comprising calculating the active power and/or the mechanical power and/or the active energy and/or the mechanical energy in the calculator according to at least one second recorded function depending at least on the nominal power datum of the motor, on the nominal current datum of the motor, on the real current, on the no-load current having been calculated and on a deviation of the nominal speed datum of the motor from a prescribed reference value of the nominal speed of the motor.

3. The method according to claim 2, wherein the first function comprises factors multiplied together, which depend respectively on the nominal power datum of the motor, on the nominal current datum of the motor, on the nominal voltage datum of the motor, on the power factor datum of the motor and on the deviation of the nominal speed datum of the motor from a prescribed reference value of the nominal speed of the motor.

4. The method according to claim 2, wherein the prescribed reference value of the nominal speed of the motor is equal to 3000 revolutions per minute.

5. The method according to claim 2, wherein the first function is of the form $$I0 = (pn)^{x1} \cdot (In)^{x2} \cdot (Un)^{x3} \cdot (\cos \varphi)^{x4} \cdot (REF - Wn)^{x5} + x6,$$

where I0 is the no-load current of the motor,
Pn is the nominal power datum of the motor,
x1, x2, x3, x4, x5, x4, x5 and x6 are prescribed real coefficients,
Pn is the nominal power datum of the motor,
In is the nominal current datum of the motor,
Un is the nominal voltage datum of the motor,
$\cos \varphi$ is the power factor datum of the motor,
Wn is the nominal speed datum of the motor,
REF is the prescribed reference value of the nominal speed of the motor.

6. The method according to claim 5, wherein
x1 is a strictly negative prescribed real coefficient,
x2 is a strictly positive prescribed real coefficient,
x3 is a strictly positive prescribed real coefficient,
x4 is a strictly negative prescribed real coefficient,
x5 is a strictly negative prescribed real coefficient,
x6 is a strictly negative prescribed real coefficient.

7. The method according to claim 1, wherein the mechanical power Pm(t) of the motor is calculated in the calculator by the following second function:

$$Pm(t) = Pn \cdot \sqrt{\log(A \cdot (I_{red}(t))^3 + B \cdot (I_{red}(t))^2 + C \cdot (I_{red}(t)) + D)}$$

where
Pn is the nominal power datum of the motor, $$I_{red}(t) = \frac{I(t)}{In}$$

I(t) is the real current,
In is the nominal current datum of the motor,
A, B, C and D are prescribed real coefficients.

8. The method according to claim 7, wherein the prescribed real coefficients A, B, C and D are different functions of the no-load current, having been calculated.

9. The method according to claim 7, wherein the prescribed real coefficient A is an exponential of a first polynomial function of the no-load current, having been calculated.

10. The method according to claim 7, wherein $$A = \exp((a_1 \cdot (I0)^2 + a_2 \cdot I0 + a_3)^2)$$

$$B = b_1 \cdot A^2 + b_2 \cdot A + b_3$$

$$C = c_1 \cdot A^2 + c_2 \cdot A + c_3$$

$$D = d_1 \cdot A^2 + d_2 \cdot A + d_3$$

where I0 is the no-load current of the motor,
$a_1, a_2, a_3, b_1, b_2, b_3, c_1, c_2, c_3, d_1, d_2, d_3$ are prescribed real coefficients.

11. The method according to claim 7, wherein $$A = \exp((a_1 \cdot (I0)^4 + a_2 \cdot (I0)^3 + a_3 \cdot (I0)^2 + a_4 \cdot I0 + a_5)^2)$$

$$B = -\exp((b_1 \cdot (I0)^4 + b_2 \cdot (I0)^3 + b_3 \cdot (I0)^2 + b_4 \cdot I0 + b_5)^2)$$

$$C = \exp(c_1 \cdot (I0)^4 + c_2 \cdot (I0)^3 + c_3 \cdot (I0)^2 + c_4 \cdot I0 + c_5)$$

$$D = -\exp(d_1 \cdot (I0)^4 + d_2 \cdot (I0)^3 + d_3 \cdot (I0)^2 + d_4 \cdot I0 + d_5) + 1$$

where
I0 is the no-load current of the motor, $a_1, a_2, a_3, a_4, a_5, b_1, b_2, b_3, b_4, b_5, c_1, c_2, c_3, c_4, c_5, d_1, d_2, d_3, d_4, d_5$ are prescribed real coefficients.

12. The method according to claim 1, comprising calculating the active power according to the mechanical power, the real current, the power factor datum of the motor, the nominal voltage datum of the motor and the nominal power datum of the motor.

13. The method according to claim 12, comprising calculating the active power $P_{active}(t)$ according to the following formulas:

$$P_{active}(t) = P_m(t) + P_{pertes}(t)$$

$$P_{pertes}(t) = P_{pertesnom} \cdot \left(\frac{1}{3} + \frac{2 \cdot (I_{red}(t))^2}{3}\right)$$

$$I_{red}(t) = \frac{I(t)}{In}$$

$$P_{pertesnom} = Pn \cdot \left( \frac{1}{Rendnom} - 1 \right)$$

$$Rendnom = \frac{Pn}{\sqrt{3} \cdot Un \cdot In \cdot \cos \varphi}$$

where Pm(t) is the mechanical power,
I(t) is the real current,
Pn is the nominal power datum of the motor,
Un is the nominal voltage datum of the motor,
In is the nominal current datum of the motor,
cos φ is the power factor datum of the motor.

14. The method according to claim 1, comprising calculating the active power of the motor,
calculating the active energy of the motor by temporal integration of the active power of the motor.

15. The method according to claim 1, comprising calculating the mechanical power of the motor,
calculating the mechanical energy of the motor by temporal integration of the mechanical power of the motor.

16. A computer program comprising code instructions for the implementation of the measurement method according to claim 1, when it is executed on a calculator.

17. A device for measuring an active power and/or a mechanical power and/or an active energy and/or a mechanical energy of a motor being electric, the device comprising:
at least one measurement sensor for measuring a real current of the motor,
wherein the device further comprises a calculator comprising at least one interface for inputting at least a nominal power datum of the motor, a nominal speed datum of the motor, a nominal current datum of the motor, a nominal voltage datum of the motor, a power factor datum of the motor and the real current of the motor,
the calculator being configured to calculate a no-load current of the motor according to first recorded functions depending at least on the nominal power datum of the motor, on the nominal current datum of the motor, on the nominal voltage datum of the motor and on the power factor datum of the motor,
the calculator being configured to calculate the active power and/or the mechanical power and/or the active energy and/or the mechanical energy according to at least one second recorded function depending at least on the nominal power datum of the motor, the nominal current datum of the motor, the real current and the no-load current having been calculated, the calculator comprising an output interface for providing the active power and/or the mechanical power and/or the active energy and/or the mechanical energy, having been calculated.

\* \* \* \* \*